(12) United States Patent
Gong

(10) Patent No.: US 10,026,575 B2
(45) Date of Patent: Jul. 17, 2018

(54) REED RELAY

(71) Applicant: SHENZHEN ZHIYOU BATTERY INTEGRATION TECHNOLOGY CO., LTD, Shenzhen, Guangdong (CN)

(72) Inventor: Shugang Gong, Guangdong (CN)

(73) Assignee: SHENZHEN ZHIYOU BATTERY INTEGRATION TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 15/125,123

(22) PCT Filed: Mar. 11, 2014

(86) PCT No.: PCT/CN2014/073201
§ 371 (c)(1),
(2) Date: Sep. 9, 2016

(87) PCT Pub. No.: WO2015/135130
PCT Pub. Date: Sep. 17, 2015

(65) Prior Publication Data
US 2016/0379784 A1  Dec. 29, 2016

(51) Int. Cl.
H01H 1/66 (2006.01)
H01H 50/04 (2006.01)
H01H 1/58 (2006.01)
H01H 50/10 (2006.01)
H01H 51/28 (2006.01)
H05K 1/18 (2006.01)
H05K 5/00 (2006.01)
H05K 5/02 (2006.01)
H05K 1/02 (2006.01)

(52) U.S. Cl.
CPC ........ H01H 50/047 (2013.01); H01H 1/5805 (2013.01); H01H 50/041 (2013.01);
(Continued)

(58) Field of Classification Search
CPC .................................................... H01H 51/281
(Continued)

(56) References Cited

U.S. PATENT DOCUMENTS 3,320,559 A * 5/1967 Morrison ............. H01H 51/281
174/363
3,575,678 A * 4/1971 Barton ............... H01H 11/0056
174/522

(Continued)

FOREIGN PATENT DOCUMENTS

CN          101971280 A      2/2011

OTHER PUBLICATIONS

International Search Report in corresponding PCT Application No. PCT/CN2014/073201, dated Dec. 27, 2014.

*Primary Examiner* — Alexander Talpalatski
(74) *Attorney, Agent, or Firm* — Leason Ellis LLP

(57) ABSTRACT

A reed switch relay comprises a PCB base (1) and a control assembly (2) electrically connected to the PCB base. The control assembly is mounted on the PCB base by a surface mount technology. The control assembly comprises a hollow coil (21) mounted on the PCB base, a reed switch (22) mounted in the hollow coil, and a shield layer (23) sleeving the outer surface of the hollow coil, the reed switch comprises pins, the shield layer is connected with the pins of the reed switch. In the reed relay, the control assembly is mounted on the PCB base though a surface mount technology, which ensures position tolerance and precision of the reed switch, implements full mechanization of product production, increases productivity, and satisfies requirements of mass production, thereby increasing economic benefits.

5 Claims, 3 Drawing Sheets

(52) U.S. Cl.
CPC .......... *H01H 50/10* (2013.01); *H01H 51/281* (2013.01); *H05K 1/181* (2013.01); *H05K 5/0017* (2013.01); *H05K 5/0217* (2013.01); *H05K 1/0203* (2013.01); *H05K 2201/1003* (2013.01); *H05K 2201/10053* (2013.01); *H05K 2201/10196* (2013.01); *H05K 2201/10219* (2013.01)

(58) Field of Classification Search
USPC .......................................................... 335/151
See application file for complete search history.

(56) References Cited

U.S. PATENT DOCUMENTS

| | | | | |
|---|---|---|---|---|
| 3,940,722 | A * | 2/1976 | Fox | H01H 51/281 335/151 |
| 4,188,623 | A * | 2/1980 | Suzuki | G01K 3/005 307/117 |
| 4,933,655 | A * | 6/1990 | Matsubara | H01H 51/281 335/151 |
| 5,559,482 | A | 9/1996 | Close et al. | |
| 5,963,116 | A * | 10/1999 | Endoh | H01H 51/28 29/622 |
| 6,052,045 | A * | 4/2000 | Martich | H01H 51/281 335/151 |
| 6,271,740 | B1 * | 8/2001 | Chikamatsu | H01H 51/28 335/151 |
| RE38,381 | E * | 1/2004 | Martich | H01H 51/281 335/151 |
| 7,227,436 | B2 * | 6/2007 | Wieger | H01H 36/0033 335/151 |
| 7,317,368 | B2 * | 1/2008 | Shimizu | H01H 51/281 335/151 |
| 7,920,038 | B1 * | 4/2011 | Knauer | H01H 50/10 335/151 |
| 8,063,725 | B2 * | 11/2011 | Ellis | H01H 1/66 335/151 |
| 2003/0169138 | A1 | 9/2003 | Motta | |

* cited by examiner

REED RELAY

CROSS-REFERENCE TO RELATED PATENT APPLICATIONS

This application is a U.S. National Phase Application under 35 U.S.C. § 371 of International Patent Application No. PCT/CN2014/073201, filed Mar. 11, 2014, which is incorporated herein by reference in its entirety. The International Application was published in Chinese on Sep. 17, 2015 as International Publication No. WO 2015/135130 A1.

TECHNICAL FIELD

The present invention relates to the field of electronic control devices, and more particularly to a reed relay.

BACKGROUND

As a common control assembly, relay can use a smaller current to control a larger current, use a low voltage to control a high voltage, use a direct current to control an alternating current, can complete the isolation between the control circuit and the controlled circuit, and has been widely used in automatic control, remote control, protection circuit and so on. The conventional electromagnetic relay is an electrical relay that uses the suction effect between the core of the electromagnet and the armature generated by the current within the input circuit to work, this relay has large volume, slow motion, and limited reliability and life.

The electronic appliances are developing in the direction of miniaturization and micromation, there is new requirement for the relays. As a new relay, the reed relay may meet the requirements of such development in many ways. For the so-called reed relay, a reed switch is placed inside a coil to get a reed relay.

Most of the existing reed relays are inline reed relay. In production, firstly the ribs are assembled, and then the ribs are package by plastic, and the assembly process is substantially manually completed, which is not conducive to large-scale production. Although the assembly process may be completed by a machine, the reed switch needs a secondary processing, resulting in that the position tolerance and precision of the reed switch are difficult to guarantee, such that a next step can not be processed mechanically, which greatly reduce the production efficiency, and is unable to meet the requirements of large-scale production.

SUMMARY

The object of the present invention is to provide a reed relay, to solve the problem in the prior art that a skeletal structure is used for assembly due to the existence of the ordinary reed relay, resulting in that the production procedures can not be mechanized completely, which reduce the accuracy of the product and production efficiency.

The technical solution of the present invention is a reed relay, comprising a PCB base and a control assembly electrically connected to the PCB base, wherein the control assembly is mounted on the PCB base though a surface mount technology, the control assembly comprises a hollow coil mounted on the PCB base, a reed switch mounted in the hollow coil, and a shield layer sleeving the outer surface of the hollow coil, the reed switch comprises pins, the shield layer is connected with the pins of the reed switch.

Specifically, the PCB base is fixedly provided with pads, the control assembly is welded with and electrically connected with the pads.

Preferably, the PCB base is provided with a pair of probes configured to acquire a voltage, a lower end of the probes are welded with and electrically connected with the PCB base.

Further more, one edge of the base PCB is provided with a thermistor configured to acquire a temperature, the lower end of the thermistor are welded with and electrically connected with the PCB base.

Further more, the PCB base is provided with a plastic body which packages the control assembly and is insulating and thermally conductive.

Still further, the plastic body comprises a base seat fixedly disposed on the PCB base, and a truncated cone disposed on the base seat, one side of the plastic body is provided a groove through up and down.

Preferably, the lower surface of the truncated cone is connected with the base seat and the plastic body is formed through injection molding.

Further more, the probes are inserted in the PCB base and the base seat.

Further more, the PCB base is provided with a through hole, the control assembly is received in the through hole.

Specifically, a back of the PCB base is provided with a solder ball for welding and electrically connection.

Compared with the prior art, in the reed relay of the present invention, the control assembly is mounted on the PCB base though a surface mount technology, which ensures position tolerance and precision of the reed switch, implements full mechanization of product production, increases productivity, and satisfies requirements of mass production, thereby increasing economic benefits.

DETAILED DESCRIPTION OF THE EMBODIMENT

To make the objectives, technical solutions, and advantages of the present invention clearer and more comprehensible, the following further describes the present invention in detail referring to the accompanying drawings and embodiments. It should be understood that the specific embodiment described herein is merely used to explain the present invention but is not used to limit the present invention.

The implementation of the present invention will be described in detail in conjunction with the specific embodiments below.

Figure 1:
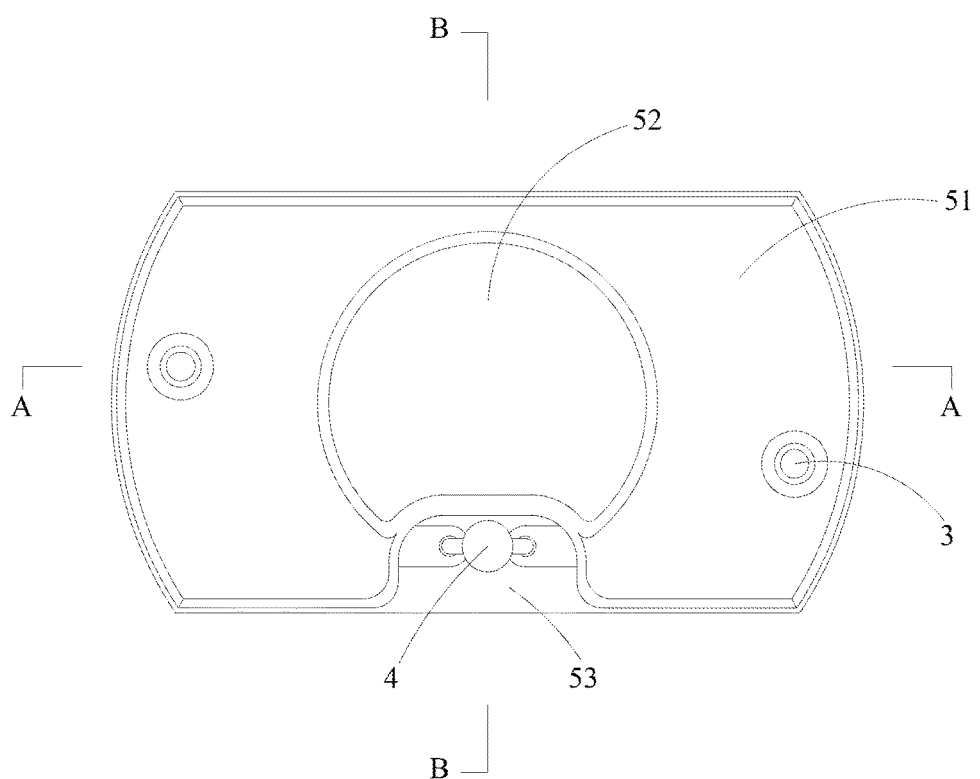
FIG. 1 is the top view of the reed relay according to an embodiment of the present invention.
Figure 2:
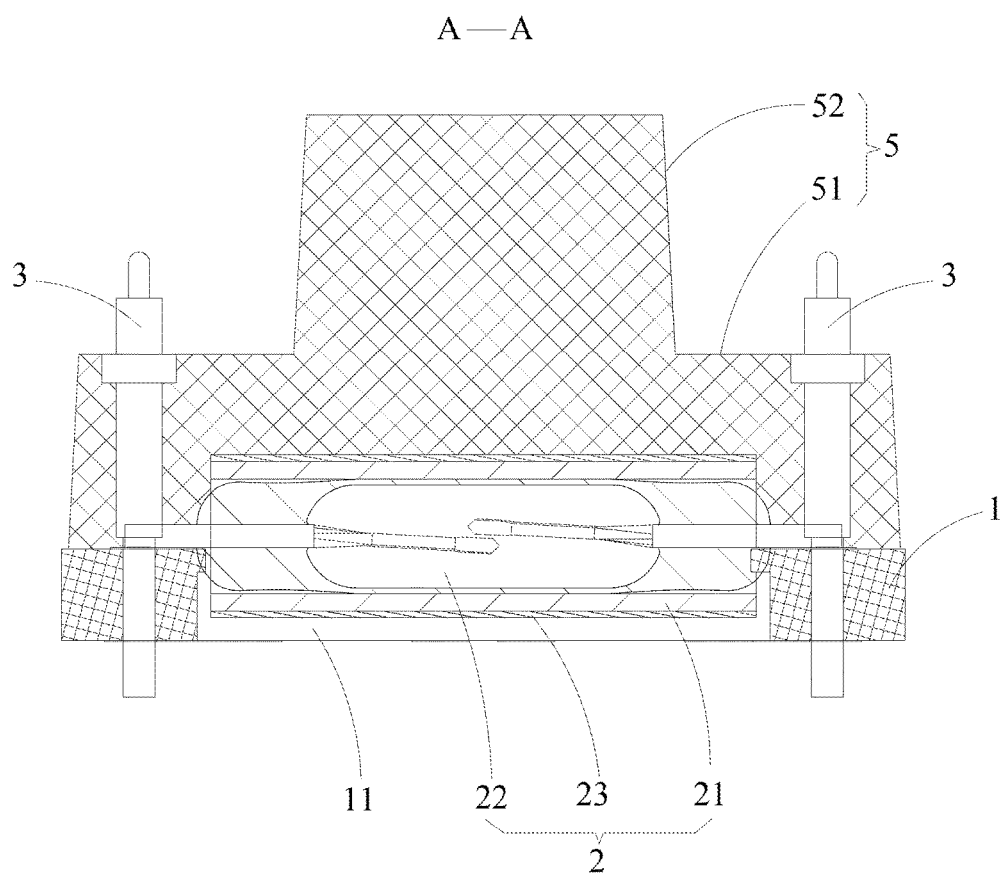
FIG. 2 is a sectional view along the A-A direction in of FIG. 1.
Figure 3:
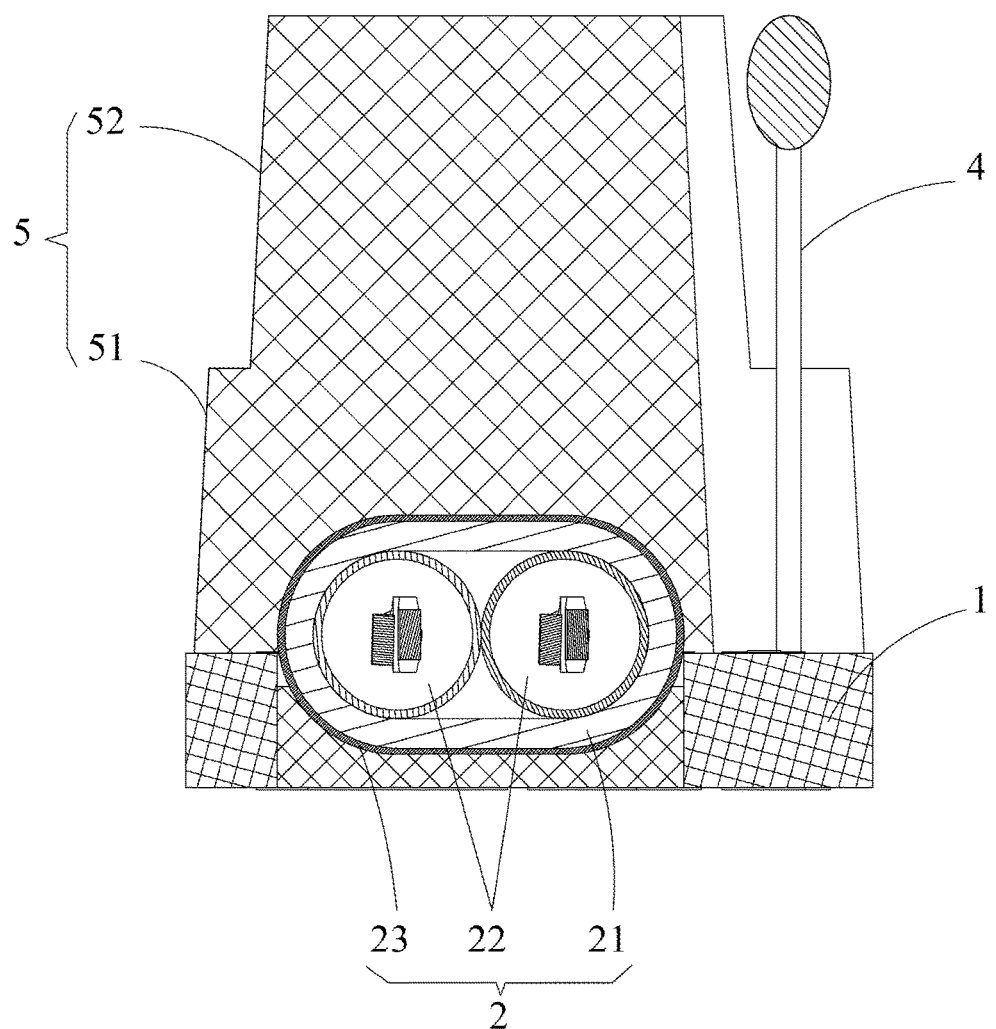
FIG. 3 a sectional view along the B-B direction of FIG. 1.

As shown in FIGS. 1-3, the present invention provides a preferred embodiment, the reed relay of the this embodiment is used in a battery pack, of course, in other embodiments, the reed relay can also be applied on the other devices.

The reed relay of this embodiment comprises a heat resisting PCB base 1 and a control assembly 2, the control assembly 2 fixedly and electrically connected to the PCB base 1. In this embodiment, the control assembly 2 is mounted on the PCB base 1 through SMT, SMT means surface mount technology. Specifically, the control assembly 2 comprises a hollow coil 21, a reed switch 22 and a shield layer 23, wherein the hollow coil 21 is fixedly and electrically connected to the PCB base 1, the reed switch 22 is disposed in the hollow coil 21. A pair of reed switches 22 arranged in parallel and being normally open is disposed in the hollow coil 21. Based on actual requirement, the reed switches 22 may comprises a normally open reed switch and a normally closed reed switch, each of both ends of the reed switch 22 is provided with a pin, the pins at both ends of the reed switches 22 are welded with and electrically connected with the PCB base 1. In addition, the outer surface of the hollow coil 21 is provided with a shield layer 23 for shielding magnetic fields, the shield layer 23 is a metal foil having a shape matched with the shape of the hollow coil 21, and the shield layer 23 is electrically connected with the pins of the reed switches 22.

The reed relay applied on the battery pack has the following characteristics:

The PCB base 1 and the control assembly 2 are individually designed, and the surface mount technology (SMT) is used, the control assembly 2 and the PCB base 1 are assembled though the surface mount technology, which ensures position tolerance and precision of the reed switch, implements full mechanization of product production, increases productivity, and satisfies requirements of mass production, thereby increasing economic benefits.

In this embodiment, the surface of the PCB base 1 is provided with pads, the control assembly 2 is welded with and electrically connected with the pads. Specifically, the pins of each component in the control assembly 2 are welded with the pads.

A pair of probes 3 extends from two ends of the PCB base 1, the two probes 3 are used to acquire voltage on the battery pack. In this embodiment, the probes 3 are fixedly and electrically connected the PCB base 1 through the steps of: pasting solder on the probes 3 and passing the probes 3 though a reflow oven. Of course, in other embodiments, according to actual situations and requirements, the probes 3 may be fixedly and electrically connected the PCB base 1 through other manner, the above-described manner belongs to one preferred embodiment, and is not intended for limitation.

A thermistor 4 i.e. NTC extends upwardly from one side of the PCB base 1, the thermistor 4 has the temperature detection range of −50° C.−+120° C. In the present embodiment, the thermistor 4 is configured to acquire and detect the temperature of the battery pack, and the temperature of the reed relay. Structurally, the bottom of the thermistor 4 is fixed on and electrically connected with the PCB base 1 through welding. Of course, in other embodiments, it is also possible to use other electronic components to acquire and detect the temperatures of the battery pack and the reed relay.

In this embodiment, the PCB base 1 is also provided with a plastic body 5, the plastic body 5 packages the controller module 2. In the production process, the assembled control assembly 2 is packaged together with the PCB base, then the whole packaged relay is packaged using the plastic. The material used for plastic package is an epoxy resin, that is, the material of the plastic body 5 is the epoxy resin which has thermal insulation properties. Of course, in other embodiments, according to actual requirements, other thermal insulation material may also be used for plastic package.

The plastic body 5 includes a base seat 51 and a truncated cone 52, wherein the base seat 51 packages the control assembly 51 on the PCB base 1, and the truncated cone 52 extends vertically and outwardly from the center position of the upper surface of the base seat 51. In addition, one side of the plastic body 5 is provided with a groove 53 for receiving the thermistor 4, the recess 53 passes through the base 51 and the outer wall of the truncated cone 52.

In this embodiment, the reed relay is applied on the battery pack, the truncated cone 52 enhances the contact strength of connecting members of the anode and cathode of the battery package, also the overall structure of the plastic body 5 compensates the gap between the anode and cathode of the battery package.

In addition, the hollow coil 21 is made of high temperature enameled wire being hot air type and having a diameter of less than 0.05 mm During the procedure of manufacturing the control assembly 2, the enameled wire is winded to form the hollow coil according to the size of the reed switch 22. In order to prevent the magnetic field generated by the coil from leaking during working and generating interference, the outer surface of the coil is implemented an installation process and coved by the shield layer 23. The plastic body 5 packages the control assembly 2, thereby effectively preventing the enameled wire of the hollow coil 21 from breaking and the reed switch 22 from rupturing.

The area of the top surface of the truncated cone 52 is smaller than the area of the bottom surface of the truncated cone 52, the bottom surface of the truncated cone 52 is connected with the base seat 51. Such arrangement allows the truncated cone 52 and the battery pack to interlock, thereby complete a fastening connection. In this embodiment, the base seat 51 and truncated cone 52 are integrately formed through injection molding, thereby forming the plastic body 5. Of course, in other embodiments, the base seat 51 and truncated cone 52 may be formed through other manufacturing process.

Since the probes 3 extend outwardly and vertically from the two ends of the PCB base 1, after packaging, the base seat 51 of the plastic seat partially covers the probes 3, the outer ends of the probes 3 protrude from the upper surface of the base seat 51, thereby facilitating the probes 3 to be electrically connected to the back pack to acquire and detect voltage thereon.

In this embodiment, the PCB base is provide with a through hole 11, the through hole 11 is configured to receive the control assemble 2, the back of the PCB base 1 is provided with solder balls for welding and electrical connection by using the BGA process, i.e., ball grid array packaging process.

Further, in this embodiment, since the diameter of the wire forming the hollow coil 21 in the reed relay is relatively small, when the wire is welded with the pin, a paint removing welding technology is used to ensure the welding between the enamelled wire and the pin, to reduce the space of the product, such that the switch function in two path may be implemented in a limited space.

The foregoing descriptions are merely preferred embodiment of the present invention, but are not intended to limit the present invention. Any modification, equivalent replacement, or improvement made without departing from the spirit and principle of the present invention shall fall within the protection scope of the present invention.

What is claimed is:

1. A reed relay, comprising a PCB base and a control assembly electrically connected to the PCB base, wherein
   the control assembly is mounted on the PCB base though a surface mount technology, the control assembly comprises a hollow coil mounted on the PCB base, a reed switch mounted in the hollow coil, and a shield layer sleeving the outer surface of the hollow coil, the reed switch comprises pins, the shield layer is connected with the pins of the reed switch;

the control assembly is welded with the PCB base for forming electric connection between the control assembly and the PCB base;

the PCB base is provided with a pair of probes configured to acquire a voltage, a lower end of the probes being welded with and electrically connected with the PCB base;

one edge of the PCB base is provided with a thermistor configured to acquire a temperature, a lower end of the thermistor being welded with and electrically connected with the PCB base;

the PCB base is provided with a plastic body which packages the control assembly and is insulating and thermally conductive; and the plastic body comprises a base seat fixedly disposed on the PCB base, and a truncated cone disposed on the base seat, one side of the plastic body is provided with a groove extending through it up and down.

2. The reed relay of claim 1, wherein the lower surface of the truncated cone is connected with the base seat and the plastic body is formed through injection molding.

3. The reed relay of claim 1, wherein the probes are inserted in the PCB base and the base seat.

4. The reed relay of claim 1, wherein the PCB base is provided with a through hole, the control assembly is received in the through hole.

5. The reed relay of claim 4, wherein a back of the PCB base is provided with a solder ball for welding and electric connection.

* * * * *